(12) United States Patent
Seebacher et al.

(10) Patent No.: US 11,831,279 B2
(45) Date of Patent: Nov. 28, 2023

(54) MILLIMETER-WAVE POWER AMPLIFIER

(71) Applicant: Infineon Technologies AG, Neubiberg (DE)

(72) Inventors: David Seebacher, Villach (AT); Matteo Bassi, Villach (AT); Dmytro Cherniak, Villach (AT); Fabio Padovan, Villach (AT)

(73) Assignee: Infineon Technologies AG, Neubiberg (DE)

(*) Notice: Subject to any disclaimer, the term of this patent is extended or adjusted under 35 U.S.C. 154(b) by 407 days.

(21) Appl. No.: 17/227,755

(22) Filed: Apr. 12, 2021

(65) Prior Publication Data

US 2022/0329206 A1  Oct. 13, 2022

(51) Int. Cl.
*H03F 1/02* (2006.01)
*H03F 3/24* (2006.01)

(52) U.S. Cl.
CPC ........... *H03F 1/0205* (2013.01); *H03F 3/245* (2013.01); *H03F 2200/294* (2013.01); *H03F 2200/451* (2013.01)

(58) Field of Classification Search
CPC .............................. H03F 1/0205; H03F 3/245
USPC .......................................................... 330/296
See application file for complete search history.

(56) References Cited

U.S. PATENT DOCUMENTS

| | | | | |
|---|---|---|---|---|
| 9,641,141 | B1* | 5/2017 | Zheng | H03F 3/2171 |
| 2015/0280655 | A1* | 10/2015 | Nobbe | H03F 3/193 |
| | | | | 330/296 |
| 2019/0348955 | A1* | 11/2019 | Day | H03F 3/19 |
| 2020/0083847 | A1* | 3/2020 | Seetharam | H03F 3/45179 |
| 2021/0226595 | A1* | 7/2021 | Enomoto | H03F 1/0227 |
| 2022/0102070 | A1* | 3/2022 | Fard | H03F 3/45188 |

OTHER PUBLICATIONS

Chillara, Vamshi Krishna et al., "An 860μW 2.1-to-2.7GHz All-Digital PLL-Based Frequency Modulator with a DTC-Assisted Snapshot TDC for WPAN (Bluetooth Smart and ZigBee) Applications", ISSCC 2014/ Session 9/ Low Power Wireless/9.8, Feb. 2014, 3 pages.

Da Dalt, Nicola "Markov Chains-Based Derivation of the Phase Detector Gain in Bang-Bang PLLs", IEEE Transactions on Circuits and Systems—II: Express Briefs, vol. 53, No. 11, Nov. 2006, 5 pages.

Da Dalt, Nicola "Linearized Analysis of a Digital Bang-Bang PLL and Its Validity Limits Applied to Jitter Transfer and Jitter Generation", IEEE Transactions on Circuits and Systems—I: Regular Papers, vol. 55, No. 11, Dec. 2008, 13 pages.

(Continued)

*Primary Examiner* — Patricia T Nguyen
(74) *Attorney, Agent, or Firm* — Slater Matsil, LLP (57) ABSTRACT

In accordance with an embodiment, a method for operating a millimeter-wave power amplifier including an input transistor having an output node coupled to a load path of a cascode transistor includes: receiving a millimeter-wave transmit signal at a control node of the input transistor; amplifying the millimeter-wave transmit signal to form an output signal; providing the output signal to a load coupled to an output node of the cascode transistor; and adjusting a first DC bias current of the input transistor to form a substantially constant second DC bias current of the cascode transistor.

20 Claims, 9 Drawing Sheets

(56) References Cited

OTHER PUBLICATIONS

Deltimple, N., et al., "Dynamic Biasing Techniques for RF Power Amplifier Linearity and Efficiency Improvement", IEEE International Conference on Integrated Circuit Design and Technology, Jul. 15, 2010, 4 pages.

Dunning, Jim et al., "An All-Digital Phase-Locked Loop with 50-Cycle Lock Time Suitable for High-Performance Microprocessors", IEEE Journal of Solid-State Circuits, vol. 30, No. 4, Apr. 1995, 11 pages.

Gao, Xiang et al., "A 2.7-to-4.3GHZ, 0.16psrms-Jitter, −246.8dB-FOM, Digital Fractional-N Sampling PLL in 28nm CMOS", ISSCC 2016 / Session 9 / High-Performance Wireless / 9.6, Feb. 2, 2016, 3 pages.

Hsu, Chung-Ming et al., "A Low-Noise Wide-BW 3.6-GHz Digital ΔΣ Fractional-N Frequency Synthesizer With a Noise-Shaping Time-to-Digital Converter and Quantization Noise Cancellation", IEEE Journal of Solid-State Circuits, vol. 43, No. 12, Dec. 2008, 11 pages.

Jin, Sangsu et al., "Enhanced Linearity of CMOS Power Amplifier Using Adaptive Common Gate Bias Control", IEEE MTT-S International Microwave Symposium Digest (MTT), Jan. 6, 2014, 4 pages.

Levantino, Salvatore et al., "Bang-Bang Digital PLLs", ESSCIRC Conference 2016: 42nd European Solid-State Circuits Conference, Sep. 12-15, 2016, 6 pages.

Levantino, Salvatore et al., "An Adaptive Pre-Distortion Technique to Mitigate the DTC Nonlinearity in Digital PLLs", IEEE Journal of Solid-State Circuits, vol. 49, No. 8, Aug. 2014, 11 pages.

Lindsey, William C., et al., "A Survey of Digital Phase-Locked Loops", IEEE, vol. 69, No. 4, Apr. 1981, 22 pages.

Markulic, Nereo et al., "A Self-Calibrated 10Mb/s Phase Modulator with −37.4dB EVM Based on a 10.1-to-12.4GHZ, −246.6dB-FOM, Fractional-N Subsampling PLL", ISSCC 2016 / Session 9 / High-Performance Wireless / 9.7, Feb. 2, 2016, 3 pages.

Marzin, Giovanni et al., "A Background Calibration Technique to Control Bandwidth in Digital PLLs", ISSCC 2014 / Session 2 / Ultra-High Speed Transceiver and Techniques / 2.9, Feb. 9-13, 2014, 3 pages.

Narayanan, Aravind Tharayil et al., "Fractional-N Sub-Sampling PLL using a Pipelined Phase-Interpolator With an FoM of −250 dB", IEEE Journal of Solid-State Circuits, vol. 51, No. 7, Jul. 2016, 11 pages.

Nonis, Roberto et al., "A 2.4psrms-jitter Digital PLL with Multi-Output Bang-Bang Phase Detector and Phase-Interpolator-Based Fractional-N Divider", ISSCC 2013 / Session 20 / Frequency Generation / 20.6, Feb. 17-21, 2013, 3 pages.

Obmann, Patrick et al., "Circuit Technique to Compensate PVT Variations in a 28 nm CMOS Cascode Power Amplifier", GeMiC, Mar. 16-18, 2015, Nurnberg, Germany, 4 pages.

Rahimi, Elham et al., "High-Efficiency SiGe-BiCMOS E-Band Power Amplifiers Exploiting Current Clamping in the Common-Base Stage", IEEE Journal of Solid-State Circuits, vol. 54, No. 8, Aug. 2019, 11 pages.

Rylyakov, A., et al., "Bang-Bang Digital PLLs at 11 and 20GHz with sub-200fs Integrated Jitter for High-Speed Serial Communication Applications", ISSCC 2009 / Session 5 / Potpourri: PLL, Optical, DSL / 5.3, Feb. 9, 2009, 3 pages.

Serhan, Ayssar et al., "Efficiency Enhancement Using Adaptive Bias Control for 60GHz Power Amplifier", IEEE 13th International New Circuits and Systems Conference (NEWCAS), Aug. 10, 2015, 4 pages.

Sievert, Sebastian et al., "A 2GHz 244fs-Resolution 1.2ps-Peak-INL Edge-Interpolator-Based Digital-to-Time Converter in 28nm CMOS", ISSCC 2016 / Session 2 / RF Frequency Synthesis Techniques / 2.9, Aug. 24, 2016, 3 pages.

Siriburanon, Teerachot et al., "A 2.2GHz-242dB-FOM 4.2mW ADC-PLL Using Digital Sub-Sampling Architecture", ISSCC 2015 / Session 25 / Frequency Generation From GHz to THz / 25.2, Feb. 2015, 3 pages.

Staszewski, Robert Bogdan et al., "All-Digital TX Frequency Synthesizer and Discrete-Time Receiver for Bluetooth Radio in 130-nm CMOS", IEEE Journal of Solid-State Circuits, vol. 39, No. 12, Dec. 2004, 14 pages.

Straayer, Matthew Z., et al., "A Multi-Path Gated Ring Oscillator TDC With First-Order Noise Shaping", IEEE Journal of Solid-State Circuits, vol. 44, No. 4, Apr. 2009, 10 pages.

Talegaonkar, M., et al., "A 4.4-5.4GHz Digital Fractional-N PLL Using ΔΣ Frequency-to-Digital Converter", IEEE Symposium on VLSI Circuits Digest of Technical Papers, Jun. 10-13, 2014, 2 pages.

Tasca, Davide et al., "A 2.9-4.0-GHz Fractional-N Digital PLL With Bang-Bang Phase Detector and 560-fsrms Integrated Jitter at 4.5-mW Power", ISSCC 2011 / Session 5, PPLs / 5.1, Aug. 30, 2011, 3 pages.

Temporiti, Enrico et al., "A 3.5 GHz Wideband ADPLL With Fractional Spur Suppression Through TDC Dithering and Feedforward Compensation", IEEE Journal of Solid-State Circuits, vol. 45, No. 12, Dec. 2010, 14 pages.

Venerus, Christian et al., "A TDC-Free Mostly-Digital FDC-PLL Frequency Synthesizer With a 2.8-3.5 GHz DCO", IEEE Journal of Solid-State Circuits, vol. 50, No. 2, Feb. 2015, 14 pages.

Weltin-Wu, Colin et al., "A Highly-Digital Frequency Synthesizer Using Ring-Oscillator Frequency-to-Digital Conversion and Noise Cancellation", ISSCC 2015 / Session 25 / RF Frequency Generation From GHz to THz / 25.1, Feb. 22-26, 3 pages.

Zanuso, Marco et al., "Noise Analysis and Minimization in Bang-Bang Digital PLLs", IEEE Transactions on Circuits and Systems—II: Express Briefs, vol. 56, No. 11, Nov. 2009, 5 pages.

Zanuso, Marzo et al., "A Wideband 3.6 GHz Digital ΔΣ Fractional-N PLL With Phase Interpolation Divider and Digital Spur Cancellation" IEEE Journal of Solid-State Circuits, vol. 46, No. 3, Mar. 2011, 12 pages.

Cherniak, Dmytro et al., "A 23-GHz Low-Phase-Noise Digital Bang-Bang PLL for Fast Triangular and Sawtooth Chirp Modulation", IEEE Journal of Solid-State Circuits, vol. 53, No. 12, Dec. 2018, 11 Pages.

EK, Staffan et al., "A 28-nm FD-SOI 115-fs Jitter PLL-Based LO System for 24-30-GHz Sliding-IF 5G Transceivers", IEEE Journal of Solid-State Circuits, vol. 53, No. 7, Jul. 2016, 13 pages.

Levantino, Salvatore, "Digital Phase-Locked Loops", Politecnico, Milano 1863, Sand Diego, Apr. 8, 2018, 79 pages.

Padovan, Fabrio et al., "A Quad-Core 15GHz BiCMOS VCO with −124dBc/Hz Phase Noise at 1MHz Offset, −189dBc/Hz FOM, and Robust to Multimode Concurrent Oscillations", ISSCC, Session 23, LO Generation 23.6, Italy, Feb. 14, 2018, 3 pages.

Pellerano, Stefano et al., "4.75-GHz Fractional Frequency Divider-by-1.25 With TDC-Based All-Digital Spur Calibration in 45-nm CMOS", IEEE Journal of Solid-State Circuits, vol. 44, No. 12, Dec. 2009, 12 pages.

Seong, Tacho et al., "A 320-fs RMS Jitter and −75-dBc Reference-Spur Ring-DCO-Based Digital PLL Using an Optimal-Threshold TDC", IEEE Journal of Solid-State Circuits, vol. 54, No. 9, Sep. 2019, 12 pages.

* cited by examiner

MILLIMETER-WAVE POWER AMPLIFIER

TECHNICAL FIELD

The present invention relates generally to a system and method for an electronic system, and, in particular embodiments, to a system and method for a millimeter-wave power amplifier.

BACKGROUND

Applications in the millimeter-wave frequency regime have gained significant interest in the past few years due to the rapid advancement in low cost semiconductor technologies such as silicon germanium (SiGe) and fine geometry complementary metal-oxide semiconductor (CMOS) processes. Availability of high-speed bipolar and metal-oxide semiconductor (MOS) transistors has led to a growing demand for integrated circuits for mm-wave applications at 60 GHz, 77 GHz, and 80 GHz and also beyond 100 GHz. Such applications include, for example, automotive radar and multi-gigabit communication systems.

The design of millimeter-wave circuits presents a number of technical challenges. For example, transmission line effects that are generally negligible for integrated circuit-based implementations at lower frequencies become prominent at millimeter-wave frequencies due to the relatively short wavelengths of millimeter-wave signals. At these high frequencies, signal routing and parasitic inductances and capacitances may significantly effect on-chip impedances, which may, in-turn, degrade gain, distortion, power efficiency, noise and stability.

In order to address these challenges, transmission line effects are generally modeled and simulated during the design phase of a millimeter-wave circuit, and various high-frequency circuit design techniques are applied in order to ensure adequate performance. However, transmission line effects are particularly challenging with respect to the design of multi-stage, high-frequency power amplifiers that are targeted for high power output and high efficiency.

SUMMARY

In accordance with an embodiment, a method for operating a millimeter-wave power amplifier including an input transistor having an output node coupled to a load path of a cascode transistor includes: receiving a millimeter-wave transmit signal at a control node of the input transistor; amplifying the millimeter-wave transmit signal to form an output signal; providing the output signal to a load coupled to an output node of the cascode transistor; and adjusting a first DC bias current of the input transistor to form a substantially constant second DC bias current of the cascode transistor.

In accordance with another embodiment, a millimeter-wave power amplifier includes: a cascode transistor having an output node configured to be coupled to a load; an input transistor having an output node coupled to a load path of the cascode transistor; and a bias circuit coupled to the input transistor and the cascode transistor, the bias circuit configured to adjust a first DC bias current of the input transistor to form a substantially constant second DC bias current of the cascode transistor.

In accordance with a further embodiment, a millimeter-wave power amplifier includes: a first signal path including a first input transistor, and a first cascode transistor having a first reference node coupled to a first output node of the first input transistor; a second signal path including a second input transistor, and a second cascode transistor having a second reference node coupled to a second output node of the second input transistor; a further cascode transistor configured to receive a reference current at a bias reference node; a first amplifier having a first input coupled to the bias reference node and a second input coupled to the first reference node of the first cascode transistor and to the second reference node of the second cascode transistor; and a first diode connected transistor coupled to an output of the first amplifier and coupled to a first control node of the first input transistor and a second control node of the second input transistor.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In an embodiment, a millimeter-wave power amplifier includes a cascode transistor having an output node configured to be coupled to a load; an input transistor having an output node coupled to a load path of the cascode transistor; and a bias circuit coupled to the input transistor and the cascode transistor. The bias circuit is configured to adjust a first DC bias current of the input transistor to form a substantially constant second DC bias current of the cascode transistor. By biasing the input transistor in this manner, sufficient DC current can be supplied to the cascode transistor to allow for class AB operation at high signal levels.

FIG. 1 illustrates a schematic of an exemplary millimeter-wave power amplifier that includes an input stage having input transistors $T_{1P}$ and $T_{1N}$ and a cascode stage operating as a common base amplifier having cascode transistors $T_{2P}$ and $T_{2N}$. In the depicted power amplifier, the input stage operates as a common emitter stage, and the cascode stage operates as a common base stage. An RF input signal $RF_{IN}$ is introduced at the bases of input transistors $T_{1P}$ and $T_{1N}$ via input transformer 106, and the output of the cascode stage is coupled to a load represented as resistor $R_L$ via output transformer 104. Input transistors $T_{1P}$ and $T_{1N}$ are biased by diode connected transistor $T_3$ that is DC coupled to the bases of input transistors $T_{1P}$ and $T_{1N}$ via the center tap $V_{B1}$ of the secondary winding of input transformer 106. Diode connected transistor $T_3$ and input transistors $T_{1P}$ and $T_{1N}$ form a current mirror that mirrors bias current $I_{BIAS}$ (or a scaled version of bias current $I_{BIAS}$) from diode connected transistor $T_3$ to input transistors $T_{1P}$ and $T_{1N}$. The collectors of cascode transistors $T_{2P}$ and $T_{2N}$ are biased with supply voltage $V_{DD}$ via the center-tap of the primary winding of output transformer 104.

Figure 1A:
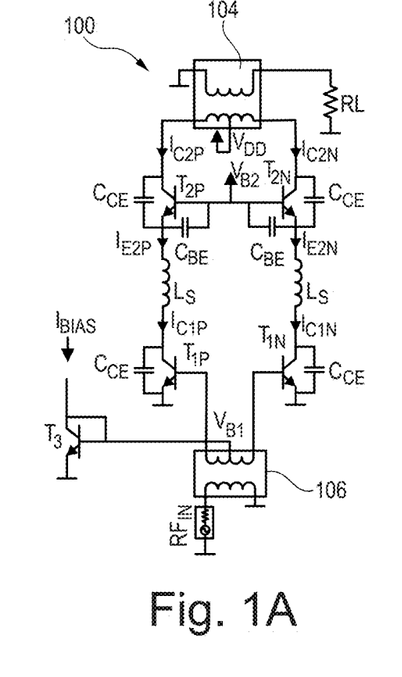
FIG. 1A illustrates a schematic of an exemplary power amplifier.

Inductors $L_S$ represent the parasitic inductance of the signal routing between the respective collectors of input transistors $T_{1P}$ and $T_{1N}$ and the respective emitters of cascode transistors $T_{2P}$ and $T_{2N}$. Capacitors $C_{CE}$ represent the respective parasitic collector-emitter capacitances of input transistors $T_1$ and $T_{1N}$ and cascode transistors $T_{2P}$ and $T_{2N}$, and capacitors $C_{BE}$ represent the respective parasitic collector-emitter capacitances of cascode transistors $T_{2P}$ and $T_{2N}$.

During operation, input transformer 106 converts single ended RF input signal $RF_{IN}$ to a differential signal at the bases of input transistors $T_{1P}$ and $T_{1N}$ via input transformer 106. This differential signal is amplified by input transistors $T_{1P}$ and $T_{1N}$ to provide output currents $I_{C1P}$ and $I_{C1N}$, which is passed to the emitters of cascode transistors $T_{2P}$ and $T_{2N}$. Output currents $I_{C2P}$ and $I_{C2N}$ are input to the primary winding of output transformer 104 to provide an amplified output signal to a load represented as resistor $R_L$ coupled to the secondary winding of output transformer 104. However, because of the effects of parasitic inductances $L_S$ and parasitic capacitances $C_{CE}$ and $C_{BE}$, AC currents $I_{E2P}$ and $I_{E2N}$ at the emitters of cascode transistors $T_{2P}$ and $T_{2N}$ are higher than AC currents $I_{C1P}$ and $I_{C2N}$ at the collectors of input transistors input transistors $T_{1P}$ and $T_{1N}$.

Figure 1B:
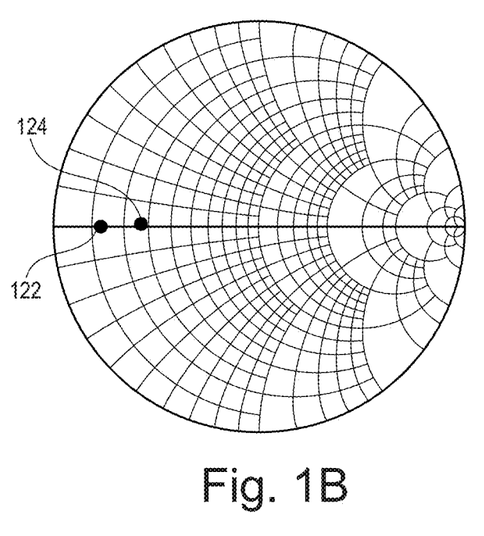
FIG. 1B illustrates a Smith chart representation of internal impedances of the power amplifier of FIG. 1A.

Parasitic inductances $L_S$ and parasitic capacitances $C_{CE}$ and $C_{BE}$ effectively cause an impedance transformation between the emitters of cascode transistors $T_{2P}$ and $T_{2N}$ and the collectors of input transistors $T_{1P}$ and $T_{1N}$ as illustrated in the Smith chart of FIG. 1B. Point 122 represents the impedance seen at the emitters of cascode transistors $T_{2P}$ and $T_{2N}$, in which each transistor has a resistive impedance of 1/gm, where gm is the transconductance of cascode transistors $T_{2P}$ and $T_{2N}$. Point 124 represents the impedance seen at the collectors of input transistors $T_{1P}$ and $T_{1N}$ after the impedance is transformed by parasitic capacitances $C_{BE}$, parasitic inductances $L_S$ and parasitic capacitances $C_{CE}$. As is apparent from the Smith chart, the transformed impedance at point 124 is higher than then the impedance at initial point 122.

Figure 1C:
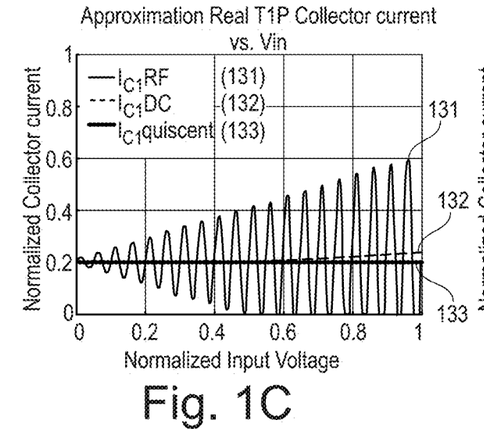
FIGS. 1C and 1D illustrate waveform diagrams associated with the performance of the power amplifier of FIG. 1A.
Figure 1D:
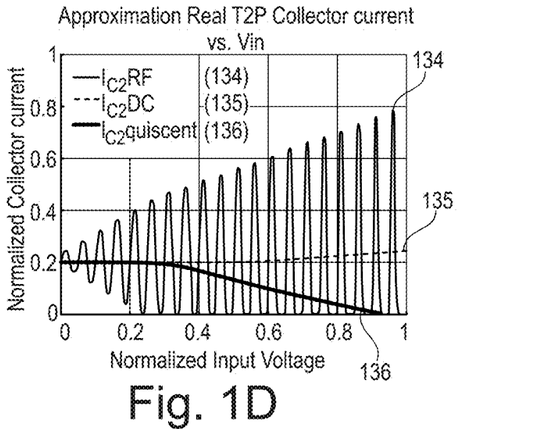

FIGS. 1C and 1D are waveform diagrams that illustrate the effect of the impedance transformation on the operation of power amplifier 100. FIG. 1C illustrates a graph of normalized RF current 131, DC current 132, and quiescent current 133 at the collector of input transistor $T_{1P}$ with respect to normalized input voltage. RF current 131 is a time domain representation of the AC and DC components of the output current, DC current 132 represents the DC component of the output current, and quiescent current 133 represents the portion of the DC current attributable to the DC bias voltage applied between the base and emitter of input transistor $T_{1P}$. As is apparent from FIG. 1C, DC current 132 is the same as quiescent current 133 up to normalized input voltages of 0.5 when the input stage of power amplifier experiences class A operation. However, at normalized input voltages above 0.5, input transistor $T_{1P}$, the RF current 131 is zero for a portion of its operation, which indicates that input transistor $T_{1P}$ experiences class AB operation. The increase of DC current 132 at normalized input voltages above 0.5 is indicative of additional DC current supplied by input transistor $T_{1P}$ as its base voltage increases in response to higher input signal levels.

FIG. 1D illustrates a graph of normalized RF current 134, DC current 135, and quiescent current 136 at the collector of cascode transistor $T_{2P}$ with respect to normalized input voltage at the input stage. RF current 134 represents the AC and DC component of the output current, DC current 135 represents the DC component of the output current, and quiescent current 136 represents the portion of the DC current attributable to the DC bias voltage applied between the base and emitter of input transistor $T_{2P}$. This DC bias voltage is the difference between applied bias voltage $V_{B2}$ and the average voltage seen at the emitter of cascode transistor $T_{2P}$.

As is apparent from FIG. 1D, DC current 135 is the same as quiescent current 136 up to normalized input voltages of about 0.25 when the cascode stage of power amplifier experiences class A operation. However, at normalized input voltages above 0.25, cascode transistor $T_{2P}$, the RF current 134 is zero for a portion of its operation, which indicates that cascode transistor $T_{CP}$ experiences class AB operation. A comparison of FIGS. 1C and 1D reveal that the cascode stage enters class AB operation lower normalized input voltages (e.g. 0.25 V) than the input stage (0.50 V). This reduction in the normalized input voltage at which the cascode stage enters class AB operation is due to the effect of the above-mentioned impedance transformation of the RF current in the amplifier that causes the AC emitter currents of cascode transistors $T_{2P}$ and $T_{2N}$ to be larger than the collector currents of input transistors $T_{1P}$ and $T_{1N}$. Since cascode transistors $T_{2P}$ and $T_{2N}$ operate at higher AC currents than input transistors $T_{1P}$ and $T_{1N}$, cascode transistors $T_{2P}$ and $T_{2N}$ transition to class AB operation at lower normalized input voltages than input transistors $T_{1P}$ and $T_{1N}$.

Additionally, it can be seen that quiescent current 136 decreases as the normalized input voltage increases when the cascode stage is in class AB operation, and RF current 134 shows signs of compression at higher normalized input voltages. As the cascode stage enters class AB operation, cascode transistors $T_{2P}$ and $T_{2N}$ effectively become "self-pinched" being effectively in class-C above a normalized input voltage of e.g. 0.9. The emitters of cascode transistors $T_{2P}$ and $T_{2N}$ are coupled to the relatively high impedances at the collectors of input transistors $T_{1P}$ and $T_{1N}$. As such, input transistors $T_{1P}$ and $T_{1N}$ function as current sources that limit the ability of cascode transistors $T_{2P}$ and $T_{2N}$ to draw additional current. This results in a reduction of gain and a decreased 1 dB compression point for amplifier 100.

Figure 2A:
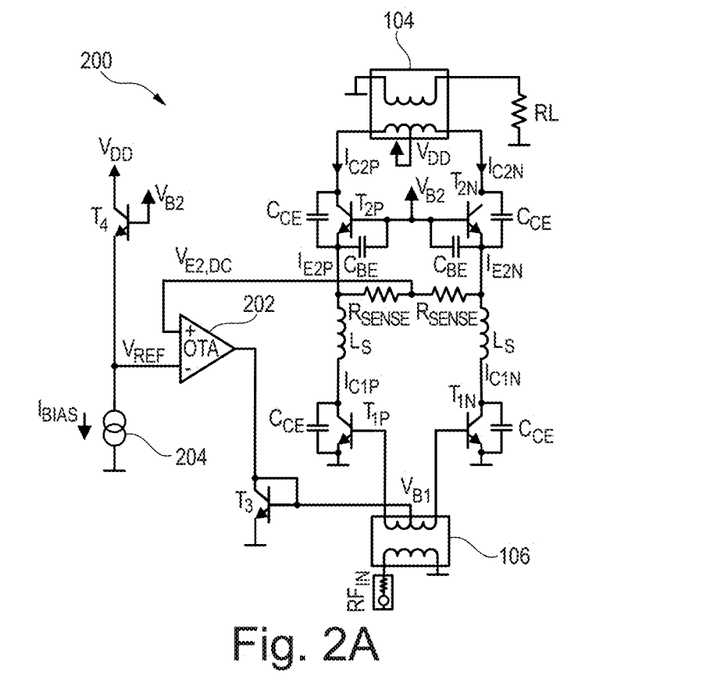
FIG. 2A illustrates a schematic a power amplifier according to an embodiment.

FIG. 2A illustrates a schematic of power amplifier 200 in which input transistors $T_{1P}$ and $T_{1N}$ are biased in a manner that advantageously maintain a substantially constant bias current in cascode transistors $T_{2P}$ and $T_{2N}$ even when power amplifier 200 operates as a class AB amplifier. The topology of power amplifier 200 is similar to the topology of power amplifier 100 shown in FIG. 1A with the exception that a feedback circuit forming a bias feedback loop is added to control the bias current of input transistors $T_{1P}$ and $T_{1N}$. As shown, the common mode voltage $V_{E2,DC}$ of the emitters of cascode transistors $T_{2P}$ and $T_{2N}$ is monitored via resistors $R_{SENSE}$ that provide access to the AC ground node separating the DC content from the AC swing of the emitter node. Alternatively, this monitoring could also be achieved using inductors. Bias reference voltage $V_{REF}$ at a bias reference node is generated by applying bias current $I_{BIAS}$ generated by reference current source 204 to the emitter of bias transistor $T_4$ (also referred to as a "cascode reference transistor" or "further cascode transistor"), and by applying bias voltage $V_{B2}$ (also referred to as a "cascode reference voltage") to the base of bias transistor $T_4$ at a cascode bias node. Current source 204 and transistor $T_4$ may be collectively referred to as a "bias reference voltage generator." Transconductance amplifier 202 provides an amplified current having a magnitude proportional to the difference between common mode voltage $V_{E2,DC}$ and bias reference voltage $V_{REF}$. This current is mirrored by diode connected transistor $T_3$ to input transistors $T_{1P}$ and $T_{1N}$. The bias feedback loop formed by transconductance amplifier 202, transistor $T_3$, input transistors $T_{1P}$ and $T_{1N}$, and cascode transistors $T_{2P}$ and $T_{2N}$ adjusts the bias current of input transistors $T_{1P}$ and $T_{1N}$ such that the common mode voltage $V_{E2,DC}$ of the emitters of cascode transistors $T_{2P}$ and $T_{2N}$ is very close to the bias reference voltage $V_{REF}$. While the emitters of input transistors $T_{1P}$ and $T_{1N}$ are shown coupled directed to ground, it should be understood that in some embodiments, the emitters of input transistors $T_{1P}$ and $T_{1N}$ may be coupled to ground (or to another reference voltage node) via a degeneration resistor or other component.

Because the bases of cascode transistors $T_{2P}$ and $T_{2N}$ are biased to the same voltage $V_{B2}$ as the base of bias transistor $T_4$, the DC component of the base-emitter voltage of cascode transistors $T_{2P}$ and $T_{2N}$ is the substantially the same as the base-emitter voltage of bias transistor $T_4$. Accordingly, the DC quiescent current of cascode transistors $T_{2P}$ and $T_{2N}$ is proportional to bias current $I_{BIAS}$ flowing through transistor $T_4$. In various embodiments, the ratio of the DC quiescent current of cascode transistors $T_{2P}$ and $T_{2N}$ to bias current $I_{BIAS}$ is related to the emitter area ratio between each of cascode transistors $T_{2P}$ and $T_{2N}$ and bias transistor $T_4$. For example, if the emitter areas of cascode transistors $T_{2P}$ and $T_{2N}$ are each equal to the emitter area of bias transistor $T_4$, the DC quiescent current of each of cascode transistors $T_{2P}$ and $T_{2N}$ is substantially $I_{BIAS}$. On the other hand, if the emitter areas of cascode transistors $T_{2P}$ and $T_{2N}$ are each k times larger than the emitter area of bias transistor $T_4$, the DC quiescent current of each of cascode transistors $T_{2P}$ and $T_{2N}$ is substantially k $I_{BIAS}$. The accuracy of DC quiescent current of each of cascode transistors $T_{2P}$ and $T_{2N}$ and $I_{BIAS}$ depends on how well cascode transistors $T_{2P}$ and $T_{2N}$ are matched and depends on the loop gain of the bias feedback loop.

Figure 2B:
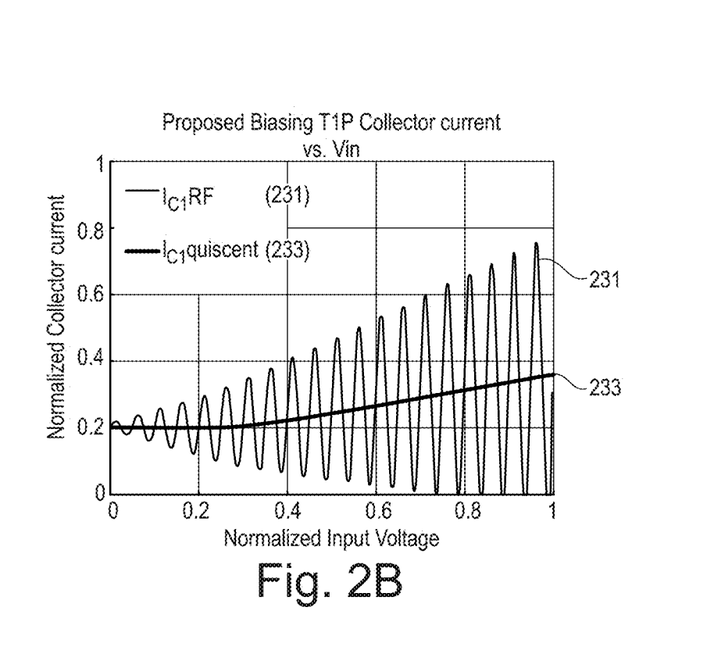
FIGS. 2B and 2C illustrate waveform diagrams associated with the power amplifier of FIG. 2A.
Figure 2C:
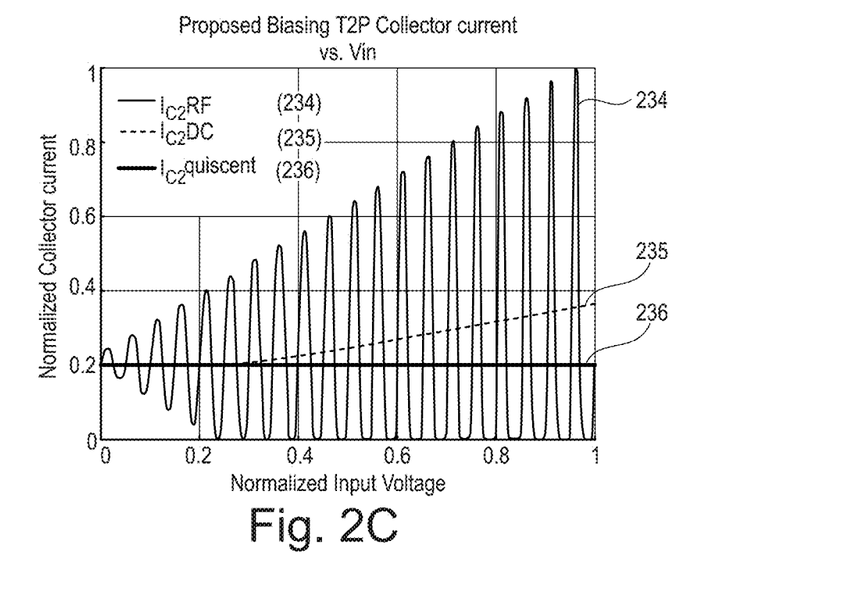

FIGS. 2B and 2C are waveform diagrams that illustrate the effect of the bias feedback loop on the operation of power amplifier 200. FIG. 2B illustrates a graph of normalized RF current 231 and quiescent current 233 at the collector of input transistor $T_{1P}$ with respect to normalized input voltage. As shown, quiescent current 133 is constant up to normalized input voltages of 0.3. At this point, cascode transistors $T_{2P}$ and $T_{2N}$ undergoes class AB operation, which causes the bias control loop to increase its bias current.

FIG. 2C illustrates a graph of normalized RF current 234, DC current 235, and quiescent current 236 at the collector of cascode transistor $T_{2P}$ with respect to normalized input voltage at the input stage. As is apparent from FIG. 2C, DC current 232 is the same as quiescent current 233 up to normalized input voltages of about 0.3 as the cascode stage of power amplifier experiences class A operation. However, at normalized input voltages above 0.3, cascode transistor $T_{2P}$, the RF current 234 is zero for a portion of its operation, which indicates that cascode transistor $T_{CP}$ experiences class AB operation. However, unlike the operation of power amplifier 100 shown in the waveform diagram of FIG. 1D described above, the quiescent current 136 stays substantially constant due to the operation of the bias feedback loop as the normalized input voltage increases. It can also be seen that the normalized output current reaches 1 for power amplifier 200, while the normalized output current of power amplifier 100 only reaches about 0.78 under similar operation conditions. Thus, the use of an embodiment bias feedback loop advantageously increases the 1 dB compression point of power amplifier 200.

Figure 2D:
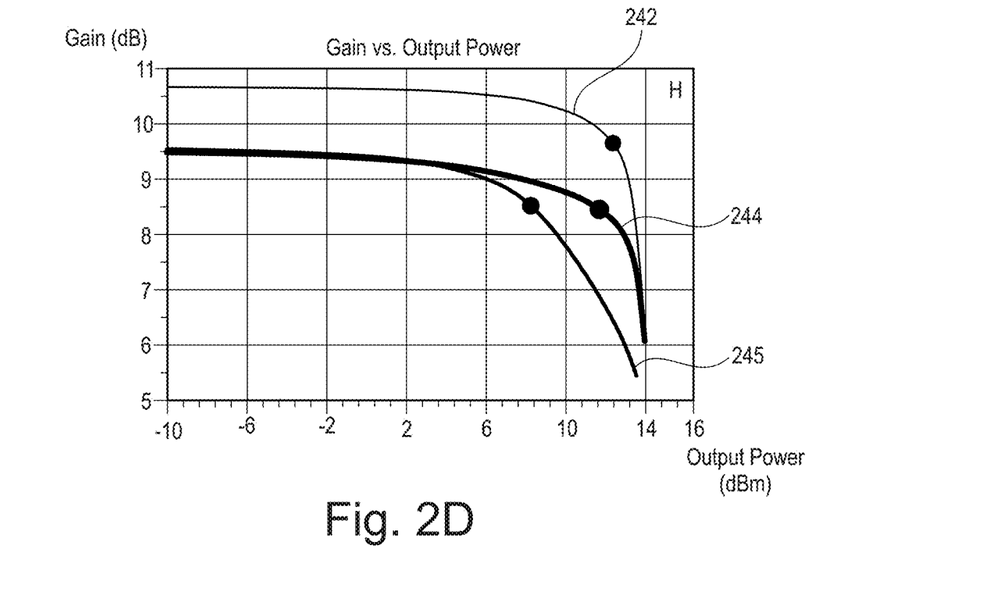
FIG. 2D illustrates a plot of gain with respect to output power for different power amplifier configurations.

FIG. 2D illustrates a plot of gain with respect to output power for a variety of different power amplifier configurations operating at 100 GHz. Trace 242 represents the gain of a class-A power amplifier, trace 244 represents the gain of embodiment power amplifier 200 shown in FIG. 2A, and trace 245 illustrates the gain of exemplary power amplifier 100 shown in FIG. 1A. As apparent from FIG. 2D, both the class-A power amplifier and embodiment power amplifier 200 (with the bias feedback loop) have a 1 dB compression point of between 11 dB and 12 dB. Exemplary power amplifier 100, on the other hand, has a lower 1 dB compression point of about 8 dB.

Figure 2E:
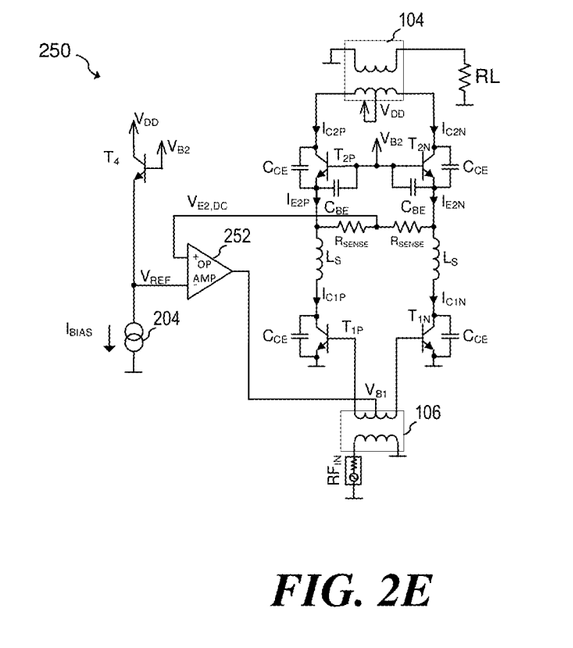
FIG. 2E illustrates a schematic of a power amplifier according to another embodiment.

FIG. 2E illustrates power amplifier 250 according to an alternative embodiment of the present invention. Power amplifier 250 is similar to power amplifier 200 shown in FIG. 2A, with the exception that transconductance amplifier 202 and diode connected transistor $T_3$ is replaced with operational amplifier 252. During operation, operational amplifier 252 amplifies the difference between common mode voltage $V_{E2,DC}$ and bias reference voltage $V_{REF}$ and applies an amplified voltage difference $V_{B1}$ to the bases of input transistors $T_{1P}$ and $T_{1N}$ via input transformer 106. The quiescent current through cascode transistors $T_{2P}$ and $T_{2N}$ is proportional to bias current $I_{BIAS}$ as described above with respect to the embodiment of FIG. 2A.

It should be understood that the embodiments of FIGS. 2A and 2E illustrate two specific examples of power amplifier that utilize bias feedback loops to maintain a substantially constant quiescent current in cascode transistors $T_{2P}$ and $T_{2N}$. It should be understood that other bias feedback topologies may be used in alternative embodiments, and that embodiments of the present invention are not limited to power amplifiers of a cascode configuration. Embodiment concepts may also be applied to amplifiers having other topologies, such as amplifiers having a stacked configuration.

It should be further appreciated that while the power amplifiers disclosed herein are implemented using bipolar junction transistors, other transistor types could be used including, but not limited to metal oxide semiconductor field effect transistors (MOSFETs), heterojunction field effect transistors (HFETs), implemented high electron mobility transistors (HEMTs) implemented on a variety of semiconductor processes technologies including, but not limited to SiGe, GaN, CMOS, and GaAs.

Figure 3A:
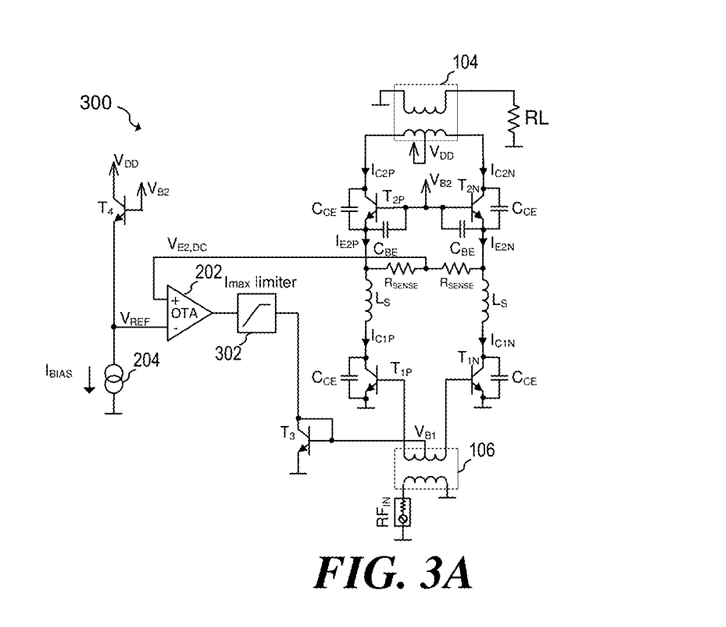
FIGS. 3A and 3B illustrate schematics of power amplifiers according to further embodiments.

In some embodiments, the bias current or peak power output of a power amplifier can be controlled by limiting the current in the bias feedback loop. Power amplifier 300 shown in FIG. 3A is similar to power amplifier 200 shown in FIG. 2A, with the exception that a current limiter 302 is coupled between the output of transconductance amplifier 202 and diode connected transistor $T_3$. During operation, current limiter 302 limits the amount of current provided by transconductance amplifier to diode connected transistor $T_3$. Limiting the current through transistor $T_3$ limits the quiescent current of cascode transistors $T_{2P}$ and $T_{2N}$ to a value proportional to the current limit of current limiter 302. Current limiter 302 may be implemented using current limiting circuits known in the art. In some embodiments, the current limit of current limiter 302 is a predefined or predetermined limit current, which may be adjustable and/or programmable. By controlling the limiting current, the bias current, maximum output power and/or the 1 dB compression point of an embodiment amplifier can be adjusted and/or controlled.

Figure 3B:
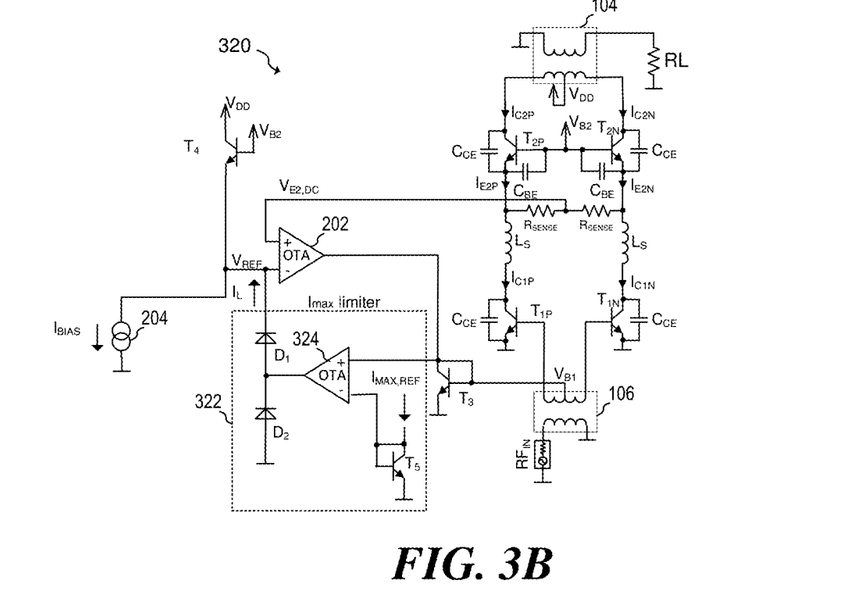

FIG. 3B illustrates a power amplifier 320 according to a further embodiment of the invention that includes current limiter 322 having an adjustable current limit. As shown, current limiter 322 includes a transconductance amplifier 324 having a first input coupled to diode connected transistor $T_3$ and a second input coupled to diode connected transistor $T_5$ configured to receive a limiting current $I_{MAX,REF}$. In some embodiments, limiting current $I_{MAX,REF}$ is programmable. The output of transconductance amplifier 324 is coupled to the input of transconductance amplifier 202 via diode $D_1$. Diode $D_2$ is coupled between the output of transconductance amplifier 324 and ground. During operation, transconductance amplifier 324 compares the base-emitter voltage of transistor $T_4$ with the base-emitter voltage of transistor $T_5$. When the base-emitter voltage of transistor $T_3$ exceeds the base-emitter voltage of transistor $T_5$, which indicates that the current supplied by transconductance amplifier to transistor $T_3$ exceeds limit current $I_{MAX,REF}$, transconductance amplifier 324 supplies current $I_L$ to node $V_{REF}$. The application of current $I_L$ to node $V_{REF}$ reduces the current flowing through bias transistor $T_4$, thereby reducing the bias current of power amplifier 320. It should be understood that the current limiting circuits depicted in FIGS. 3A and 3B are just two examples of many possible current limiting configurations that can be applied to power amplifiers according to embodiments of the present invention.

Figure 4A:
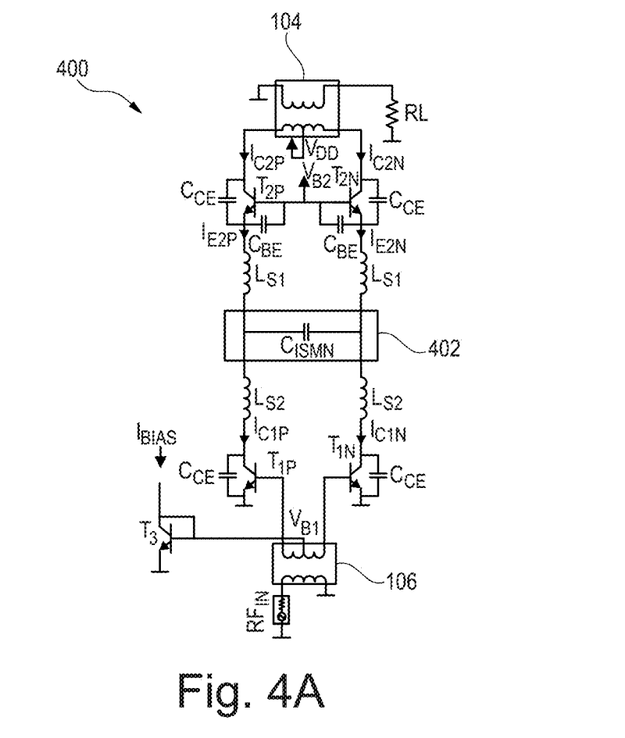
FIG. 4A illustrates a power amplifier according to a further embodiment.

In some embodiments, the effect of the impedance transformation between input transistors $T_{1P}$ and $T_{1N}$ and cascode transistors $T_{2P}$ and $T_{2N}$ on the operation of a cascode RF power amplifier described above can also be mitigated by coupling a matching network between input transistors $T_{1P}$ and $T_{1N}$ and cascode transistors $T_{2P}$ and $T_{2N}$, as shown in FIG. 4A. Inductors $L_{S1}$ represent the parasitic inductance of the signal routing between the respective emitters of cascode transistors $T_{2P}$ and $T_{2N}$ and interstage matching network 402, Inductors $L_{S2}$ represent the parasitic inductance of the signal routing between interstage matching network 402 and the respective collectors of input transistors $T_{1P}$ and $T_{1N}$, capacitors $C_{CE}$ represent the respective parasitic collector-emitter capacitances of input transistors $T_{1P}$ and $T_{1N}$ and cascode transistors $T_{2P}$ and $T_{2N}$, and capacitors $C_{BE}$ represent the respective parasitic collector-emitter capacitances of cascode transistors $T_{2P}$ and $T_{2N}$. In various embodiments, capacitor $C_{ISMN}$ compensates for the impedance transformation caused by the above-mentioned parasitic inductances and capacitances such that the impedance seen by the collectors of input transistors $T_{1P}$ and $T_{1N}$ is close to the impedance of the emitters of cascode transistors $T_{2P}$ and $T_{2N}$. Thus, interstage matching network 402 at least partially compensates for an increased impedance caused by a parasitic inductance coupled between the output nodes of the input transistors $T_{1P}$ and $T_{1N}$ and the emitters (also referred to as "reference nodes") of cascode transistors $T_{2P}$ and $T_{2N}$.

Figure 4B:
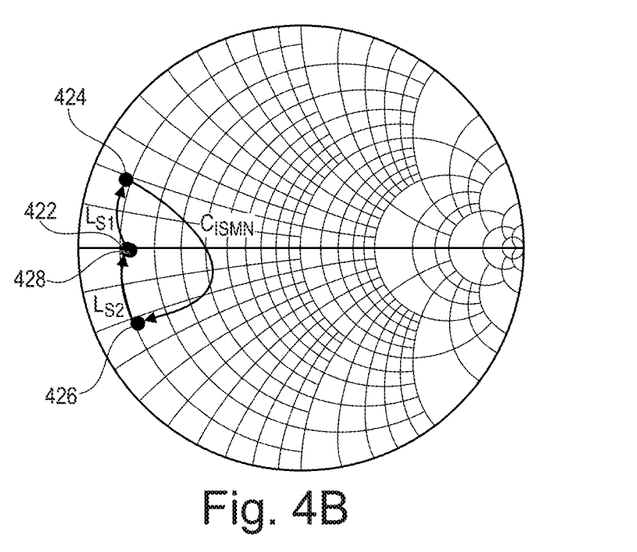
FIG. 4B illustrates a Smith chart representation of internal impedances of the power amplifier of FIG. 4A.

FIG. 4B shows a Smith chart that illustrates how matching network compensates for the impedance transformation. Point 422 represents in which each transistor has a resistive impedance of 1/gm. Point 424 represents the impedance seen at the port of interstage matching network 402 after the impedance is transformed by parasitic inductances $L_S$ and parasitic capacitances $C_{CE}$ and $C_{BE}$. Capacitor $C_{ISMIN}$ transforms the inductive impedance at point 424 to a capacitive impedance at point 426, and parasitic inductance $L_{s2}$ transforms the capacitive impedance at point 426 to a substantially real impedance at point 428, which represents the impedance seen at the collectors of input transistors $T_{1P}$ and $T_{1N}$.

It should be understood that the illustrated implementation of interstage matching network 402 using capacitor $C_{ISMIN}$ is just one specific example of many possible matching networks. In alternative embodiments of the present invention, other impedance matching networks known in the art may be used to match the impedance of the emitters of cascode transistors cascode transistors $T_{2P}$ and $T_{2N}$ to the impedance of the collectors of input transistors $T_{1P}$ and $T_{1N}$. It should also be understood that in some embodiments, interstage matching network 402 may be used to transform the impedance of the emitters of cascode transistors cascode transistors $T_{2P}$ and $T_{2N}$ to a different impedance depending on specification and requirements of the particular system. In yet further embodiments, interstage matching network 402 may also be combined with the embodiments described above in FIGS. 2A, 2E, 3A and 3B.

Figure 4C:
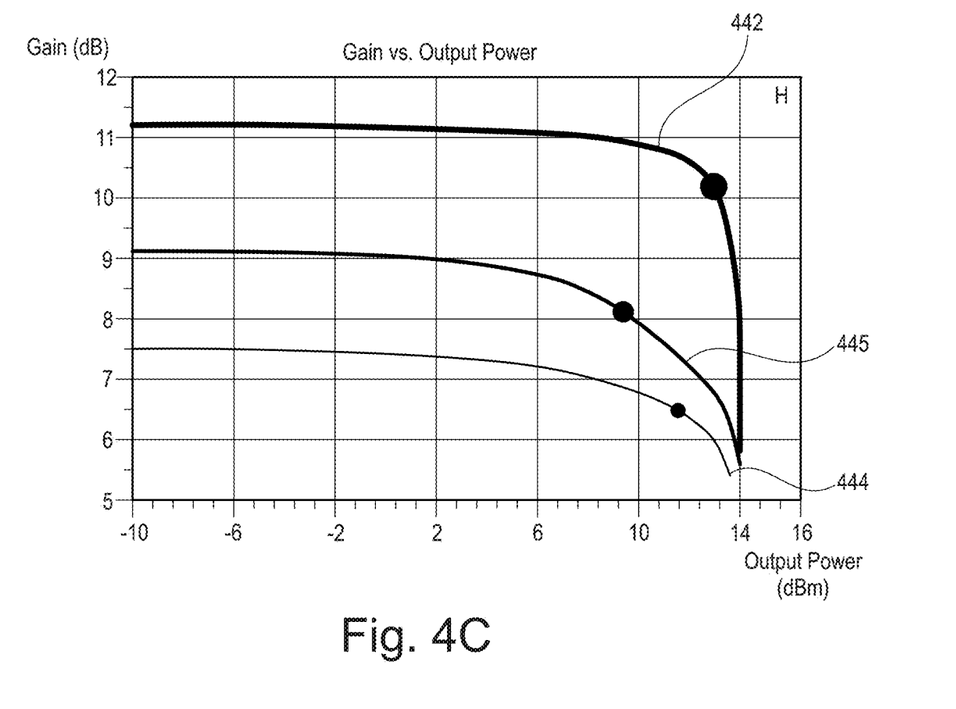
FIG. 4C illustrates a plot of gain with respect to output power for different power amplifier configurations.

FIG. 4C illustrates a plot of gain with respect to output power for a variety of different power amplifier configurations operating at 100 GHz. Trace 442 represents the gain of a class-A power amplifier, trace 444 represents the gain of embodiment power amplifier 400 with interstage the matching network shown in FIG. 4A, and trace 445 illustrates the gain of exemplary power amplifier 100 shown in FIG. 1A. As apparent from FIG. 2D, both the class-A power amplifier and embodiment power amplifier 200 (with the bias feedback loop) have a 1 dB compression point of between 11 dB and 13 dB. Exemplary power amplifier 100, on the other hand, has a lower 1 dB compression point of about 9 dB. Thus, the inclusion of interstage matching advantageously increases the 1 dB compression point of a cascode power amplifier.

Figure 5:
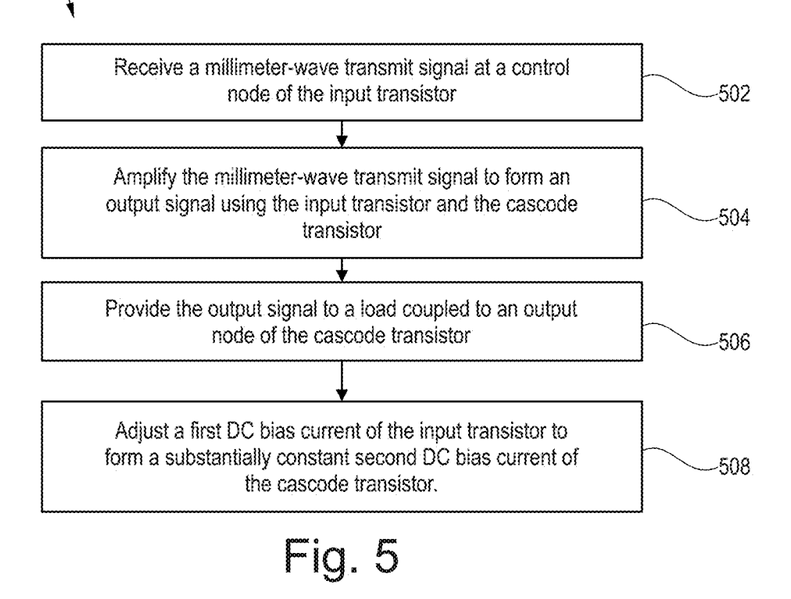
FIG. 5 illustrates a block diagram of a method according to an embodiment.

FIG. 5 illustrates a block diagram of an embodiment method 500 of operating a cascode power amplifier. In step 502, a millimeter-wave transmit signal is received at a control node of an input transistor. This input transistor may be implemented by input transistor $T1_P$ or $T_{1N}$, as shown in the embodiment of FIG. 2A, where the control node corresponds to the base of these transistors. In embodiments that utilize MOSFETs, the control node would correspond to the gate of the MOSFET. In step 504, the millimeter-wave transmit signal is amplified to form an output signal using the input transistor and a cascode transistor. This output signal is provided to a load coupled to an output node of the cascode transistor in step 506. In some embodiments, such as the embodiment of FIG. 2A, the output node of the cascode transistor may be a collector. However, in embodiments that utilize MOSFETS, the output node would be a drain of the MOSFET. In step 508, a first DC bias current of the input transistor is adjusted to form a substantially constant second DC bias current of the cascode transistor. In various embodiments, the DC bias current may be adjusted using a feedback loop as described above with respect to the embodiments of FIGS. 2A, 2E, 3A and 3B.

Figure 6A:
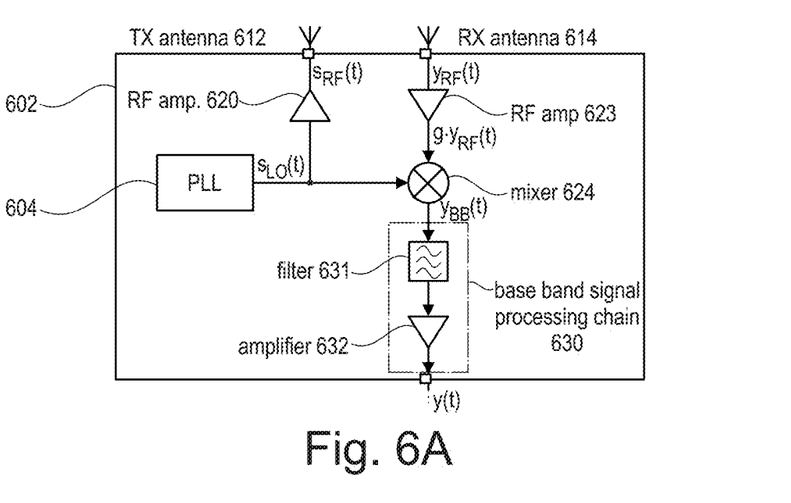
FIG. 6A illustrates a radar transceiver according to an embodiment.

FIG. 6A illustrates an embodiment radar transceiver 602 that utilizes an embodiment power amplifier as described according to the various embodiments above. As shown, radar transceiver 602 includes PLL 604 that generates an RF signal $s_{LO}(t)$, which may be frequency-modulated using frequency modulation techniques know in the art. For example, in a frequency modulated continuous wave (FMCW) radar system, RF signal $s_{LO}(t)$ may be frequency modulated to have a frequency ramp of increasing and/or decreasing frequency. Alternatively, RF signal $s_{LO}(t)$ may be frequency modulated according to other shapes and patterns, such as rectangular and sinusoidal. In radar applications, the LO signal may be in the Super High Frequency (SHF) or the Extremely High Frequency (EHF) band (e.g., between 76 GHz and 81 GHz in automotive applications).

The LO signal $s_{LO}(t)$ is processed in the transmit signal path as well as in the receive signal path. The transmit signal $s_{RF}(t)$, which is radiated by the TX antenna 612, is generated by amplifying the LO signal $s_{LO}(t)$, for example, using an RF power amplifier 620 according to embodiments of the present invention described above. The output of power amplifier 620 is coupled to the TX antenna 612. The received signal $y_{RF}(t)$, which is provided by the RX antenna 614, is provided to a mixer 624. In the present example, the received signal $y_{RF}(t)$ (i.e., the antenna signal) is pre-amplified by RF amplifier 623 (gain g), so that the mixer receives the amplified signal $g \cdot y_{RF}(t)$ at its RF input. The mixer 624 further receives the LO signal $s_{LO}(t)$ at its reference input and is configured to down-convert the amplified signal $g \cdot y_{RF}(t)$ into the base band. The resulting baseband signal at the mixer output is denoted as $y_{BB}(t)$. The base-band signal $y_{BB}(t)$ is further processed by the analog base band signal processing chain 630, which basically includes one or more filters (e.g., a band-pass filter 631) to remove undesired side bands and image frequencies as well as one or more amplifiers such as amplifier 632. The analog output signal, which may be supplied to an analog-to-digital converter is denoted as y(t). radar transceiver 602.

In the present example, the mixer 624 down-converts the RF signal $g \cdot y_{RF}(t)$ (amplified antenna signal) into the base band. The respective base band signal (mixer output signal) is denoted by $y_{BB}(t)$. The down-conversion may be accomplished in a single stage (i.e., from the RF band into the base band) or via one or more intermediate stages (from the RF band into an IF band and subsequently into the base band). It should be understood that radar transceiver 602 is just one of many possible systems that may utilize power amplifiers according to embodiments of the present invention. Embodiment power amplifiers may be used in other types of systems, such as RF transmitters and transceivers used in communication systems.

Figure 6B:
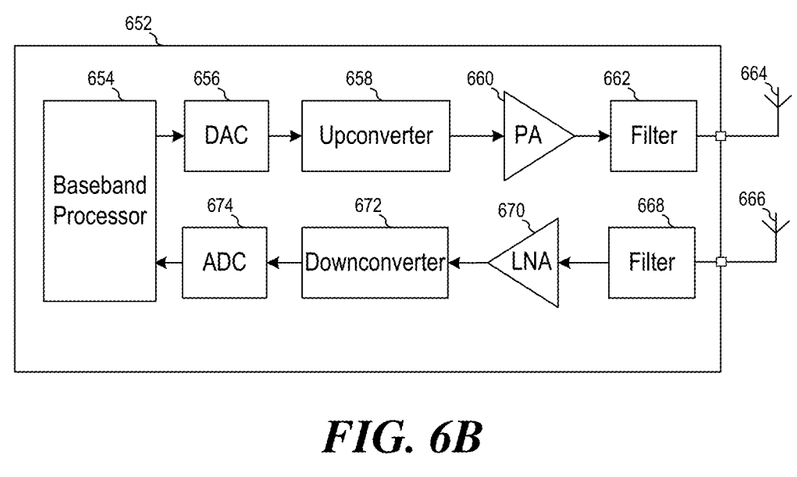
FIG. 6B illustrates an RF transceiver according to an embodiment.

FIG. 6B illustrates an embodiment RF transceiver 662 that utilizes an embodiment power amplifier as described according to the various embodiments above. RF transceiver 602 may be used, for example, in an RF communication system. As shown, RF transceiver 652 includes a baseband processor 654 that is coupled to a transmit signal path and a receive signal path. The transmit signal path includes a digital-to-analog converter (DAC) 656, upconverter 658, power amplifier 660 transmit filter 662 that may be coupled to transmit antenna 664. In various embodiments, power amplifier 660 may be implemented using a power amplifier described in embodiments above. During operation, baseband processor 654 generates a baseband signal in the digital domain, which is converted to the analog domain using DAC 656 to form an analog baseband signal. DAC 656 may be implemented using DAC circuits known in the art. The analog baseband signal is upconverted to an RF frequency using upconverter 658, which may be implemented, for example, using one or more RF mixing circuits. The output of the upconverter is amplified using embodiment power amplifier 660, and the resulting amplified RF signal is filtered using transmit filter 662 and provided to transmit antenna 664. Transmit filter 662 may be implemented using RF filter circuits and systems known in the art including, but not limited to passive LC filters, surface acoustic wave (SAW) filters.

The receive signal path includes an analog-to-to digital converter (ADC) 674, downconverter 672, low noise amplifier (LNA) 670 and receive filter 668 that may be coupled to a receive antenna 666. During operation, receive filter 668 filters an RF signal received by receive antenna 666. The filtered received signal is filtered by LNA 670, the output of which downconverted by downconverter 672. The down-converted analog signal is digitized by ADC 647, and the digitized output is processed by baseband processor 654. Receive filter 668 may be implemented RF filter circuits and systems known in the art including, but not limited to passive LC filters, surface acoustic wave (SAW) filters; downconverter 672 may by implemented using downconverter circuits and systems known in the art, such as one or more RF mixer circuits, and ADC 674 may be implemented using ADC circuits known in the art.

In some embodiments, all of the circuitry of RF transceiver 662 may be implemented on a single monolithic semiconductor integrated circuit. Alternatively, the components of RF transceiver 662 may be partitioned using multiple components. It should be understood that radar RF transceiver 662 is just one of many systems that may utilize power amplifiers according to embodiments of the present invention.

Embodiments of the present invention are summarized here. Other embodiments can also be understood from the entirety of the specification and the claims filed herein.

Example 1. A method for operating a millimeter-wave power amplifier including an input transistor having an output node coupled to a load path of a cascode transistor, the method including: receiving a millimeter-wave transmit signal at a control node of the input transistor; amplifying the millimeter-wave transmit signal to form an output signal; providing the output signal to a load coupled to an output node of the cascode transistor; and adjusting a first DC bias current of the input transistor to form a substantially constant second DC bias current of the cascode transistor.

Example 2. The method of example 1, further including: generating a bias reference voltage; and comparing a voltage of a reference node of the cascode transistor to the bias reference voltage, where adjusting the first DC bias current includes adjusting the first DC bias current until the bias reference voltage and the voltage of the reference node of the cascode transistor are substantially at a same DC voltage.

Example 3. The method of example 2, where: comparing the voltage of the reference node of the cascode transistor to the bias reference voltage includes using a transconductance amplifier; and adjusting the first DC bias current further includes providing a bias voltage for the input transistor using a diode connected transistor coupled to an output of the transconductance amplifier and to the control node of the input transistor.

Example 4. The method of one of examples 2 or 3, where generating the bias reference voltage includes: applying a reference current to a cascode reference transistor; and applying a same cascode bias voltage to a control node of the cascode transistor and a control node of the cascode reference transistor.

Example 5. The method of one of examples 1 to 4, where; the input transistor includes a first input transistor and a second input transistor; the cascode transistor includes a first cascode transistor and a second cascode transistor, where the first input transistor has an output node coupled to a load path of the first cascode transistor, and the second input transistor has an output node coupled to a load path of the second cascode transistor; and providing the output signal to the load includes providing a first phase of the output signal to the load from the first cascode transistor, and providing a second phase of the output signal to the load from the second cascode transistor.

Example 6. The method of example 5, where: receiving the millimeter-wave transmit signal includes receiving the millimeter-wave transmit signal via a first transformer coupled between a control node of the first input transistor and a control node of the second input transistor; and providing the output signal to the load includes providing the output signal to the load via a second transformer coupled between an output node of the first cascode transistor and an output node of the second cascode transistor.

Example 7. The method of one of examples 1 to 6, further including limiting the first DC bias current.

Example 8. The method of one of examples 1 to 7, further including, using an interstage matching network coupled between the output node of the input transistor and a reference node of the cascode transistor, modifying an impedance seen by the output node of the input transistor, where the interstage matching network at least partially compensates for an increased impedance caused by a parasitic inductance coupled between the output node of the input transistor and the reference node of the cascode transistor.

Example 9. A millimeter-wave power amplifier including: a cascode transistor having an output node configured to be coupled to a load; an input transistor having an output node coupled to a load path of the cascode transistor; and a bias circuit coupled to the input transistor and the cascode transistor, the bias circuit configured to adjust a first DC bias current of the input transistor to form a substantially constant second DC bias current of the cascode transistor.

Example 10. The millimeter-wave power amplifier of example 9, where the bias circuit includes: a bias reference voltage generator configured to produce a bias reference voltage; and a feedback circuit configured to adjust the first DC bias current until the bias reference voltage and a voltage of a reference node of the cascode transistor have substantially a same DC voltage.

Example 11. The millimeter-wave power amplifier of example 10, where: the feedback circuit includes a transconductance amplifier having a first input coupled to the bias reference voltage generator and a second input coupled to the reference node of the cascode transistor; and a diode connected transistor coupled to an output of the transconductance amplifier and a control node of the input transistor.

Example 12. The millimeter-wave power amplifier of example 10 or 11, where the bias reference voltage generator includes a cascode reference transistor having a load path coupled to reference current source, and a control node coupled to a cascode bias node configured to provide a cascode reference voltage, where a control node of the cascode transistor is configured to receive a same cascode reference voltage.

Example 13. The millimeter-wave power amplifier of one of examples 9 to 12, where: the input transistor includes a first input transistor and a second input transistor; and the cascode transistor includes a first cascode transistor and a second cascode transistor, where the first input transistor has an output node coupled to a load path of the first cascode transistor, and the second input transistor has an output node coupled to a load path of the second cascode transistor.

Example 14. The millimeter-wave power amplifier of example 13, further including: a first transformer having a first winding coupled between a control node of the first input transistor and a control node of the second input transistor, and a second winding configured to receive an RF input signal; and a second transformer coupled between the output node of the first cascode transistor and an output node of the second cascode transistor.

Example 15. The millimeter-wave power amplifier of one of examples 9 to 14, further including a current limiting circuit configured to limit the first DC bias current to a first predetermined limit current.

Example 16. The millimeter-wave power amplifier of one of examples 9 to 15, where the input transistor and the cascode transistor each include a bipolar junction transistor.

Example 17. A millimeter-wave power amplifier including: a first signal path including a first input transistor, and a first cascode transistor having a first reference node coupled to a first output node of the first input transistor; a second signal path including a second input transistor, and a second cascode transistor having a second reference node coupled to a second output node of the second input transistor; a further cascode transistor configured to receive a reference current at a bias reference node; a first amplifier having a first input coupled to the bias reference node and a second input coupled to the first reference node of the first cascode transistor and to the second reference node of the second cascode transistor; and a first diode connected transistor coupled to an output of the first amplifier and coupled to a first control node of the first input transistor and a second control node of the second input transistor.

Example 18. The millimeter-wave power amplifier of example 17, further including a current limiting circuit coupled between the output of the first amplifier and the first diode connected transistor.

Example 19. The millimeter-wave power amplifier of one of examples 17 or 18, further including an input transformer including: a first winding having a first end coupled to the first control node of the first input transistor, a second end coupled to the second control node of the input second transistor, and a center tap coupled to the first diode connected transistor; and a second winding configured to receive an RF input signal.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for operating a millimeter-wave power amplifier comprising an input transistor having an output node coupled to a load path of a cascode transistor, the method comprising:

receiving a millimeter-wave transmit signal at a control node of the input transistor;
amplifying the millimeter-wave transmit signal to form an output signal;
providing the output signal to a load coupled to an output node of the cascode transistor; and
adjusting a first DC bias current of the input transistor to form a substantially constant second DC bias current of the cascode transistor.

2. The method of claim 1, further comprising:
generating a bias reference voltage; and
comparing a voltage of a reference node of the cascode transistor to the bias reference voltage, wherein adjusting the first DC bias current comprises adjusting the first DC bias current until the bias reference voltage and the voltage of the reference node of the cascode transistor are substantially at a same DC voltage.

3. The method of claim 2, wherein:
comparing the voltage of the reference node of the cascode transistor to the bias reference voltage comprises using a transconductance amplifier; and
adjusting the first DC bias current further comprises providing a bias voltage for the input transistor using a diode connected transistor coupled to an output of the transconductance amplifier and to the control node of the input transistor.

4. The method of claim 2, wherein generating the bias reference voltage comprises:
applying a reference current to a cascode reference transistor; and
applying a same cascode bias voltage to a control node of the cascode transistor and a control node of the cascode reference transistor.

5. The method of claim 1, wherein;
the input transistor comprises a first input transistor and a second input transistor;
the cascode transistor comprises a first cascode transistor and a second cascode transistor, wherein the first input transistor has an output node coupled to a load path of the first cascode transistor, and the second input transistor has an output node coupled to a load path of the second cascode transistor; and
providing the output signal to the load comprises providing a first phase of the output signal to the load from the first cascode transistor, and providing a second phase of the output signal to the load from the second cascode transistor.

6. The method of claim 5, wherein:
receiving the millimeter-wave transmit signal comprises receiving the millimeter-wave transmit signal via a first transformer coupled between a control node of the first input transistor and a control node of the second input transistor; and
providing the output signal to the load comprises providing the output signal to the load via a second transformer coupled between an output node of the first cascode transistor and an output node of the second cascode transistor.

7. The method of claim 1, further comprising limiting the first DC bias current.

8. The method of claim 1, further comprising, using an interstage matching network coupled between the output node of the input transistor and a reference node of the cascode transistor, modifying an impedance seen by the output node of the input transistor, wherein the interstage matching network at least partially compensates for an increased impedance caused by a parasitic inductance coupled between the output node of the input transistor and the reference node of the cascode transistor.

9. A millimeter-wave power amplifier comprising:
a cascode transistor having an output node configured to be coupled to a load;
an input transistor having an output node coupled to a load path of the cascode transistor; and
a bias circuit coupled to the input transistor and the cascode transistor, the bias circuit configured to adjust a first DC bias current of the input transistor to form a substantially constant second DC bias current of the cascode transistor.

10. The millimeter-wave power amplifier of claim 9, wherein the bias circuit comprises:
a bias reference voltage generator configured to produce a bias reference voltage; and
a feedback circuit configured to adjust the first DC bias current until the bias reference voltage and a voltage of a reference node of the cascode transistor have substantially a same DC voltage.

11. The millimeter-wave power amplifier of claim 10, wherein:
the feedback circuit comprises a transconductance amplifier having a first input coupled to the bias reference voltage generator and a second input coupled to the reference node of the cascode transistor; and
a diode connected transistor coupled to an output of the transconductance amplifier and a control node of the input transistor.

12. The millimeter-wave power amplifier of claim 10, wherein the bias reference voltage generator comprises a cascode reference transistor having a load path coupled to reference current source, and a control node coupled to a cascode bias node configured to provide a cascode reference voltage, wherein a control node of the cascode transistor is configured to receive a same cascode reference voltage.

13. The millimeter-wave power amplifier of claim 9, wherein:
the input transistor comprises a first input transistor and a second input transistor; and
the cascode transistor comprises a first cascode transistor and a second cascode transistor, wherein the first input transistor has an output node coupled to a load path of the first cascode transistor, and the second input transistor has an output node coupled to a load path of the second cascode transistor.

14. The millimeter-wave power amplifier of claim 13, further comprising:
a first transformer having a first winding coupled between a control node of the first input transistor and a control node of the second input transistor, and a second winding configured to receive an RF input signal; and
a second transformer coupled between the output node of the first cascode transistor and an output node of the second cascode transistor.

15. The millimeter-wave power amplifier of claim 9, further comprising a current limiting circuit configured to limit the first DC bias current to a first predetermined limit current.

16. The millimeter-wave power amplifier of claim 9, wherein the input transistor and the cascode transistor each comprise a bipolar junction transistor.

17. A millimeter-wave power amplifier comprising:
a first signal path comprising a first input transistor, and a first cascode transistor having a first reference node coupled to a first output node of the first input transistor;

a second signal path comprising a second input transistor, and a second cascode transistor having a second reference node coupled to a second output node of the second input transistor;

a further cascode transistor configured to receive a reference current at a bias reference node;

a first amplifier having a first input coupled to the bias reference node and a second input coupled to the first reference node of the first cascode transistor and to the second reference node of the second cascode transistor; and a first diode connected transistor coupled to an output of the first amplifier and coupled to a first control node of the first input transistor and a second control node of the second input transistor.

18. The millimeter-wave power amplifier of claim 17, further comprising a current limiting circuit coupled between the output of the first amplifier and the first diode connected transistor.

19. The millimeter-wave power amplifier of claim 17, further comprising an input transformer comprising:

a first winding having a first end coupled to the first control node of the first input transistor, a second end coupled to the second control node of the input second transistor, and a center tap coupled to the first diode connected transistor; and a second winding configured to receive an RF input signal.

20. The millimeter-wave power amplifier of claim 17, wherein the first input transistor, the second input transistor, the first cascode transistor, the second cascode transistor and the first diode connected transistor each comprise a bipolar junction transistor.

* * * * *